(12) United States Patent
Yu

(10) Patent No.: US 6,507,087 B1
(45) Date of Patent: Jan. 14, 2003

(54) SILICIDE AGGLOMERATION POLY FUSE DEVICE

(75) Inventor: Ta Lee Yu, Chu-tong Chen (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/188,592

(22) Filed: Jul. 3, 2002

Related U.S. Application Data

(62) Division of application No. 09/933,962, filed on Aug. 22, 2001, now Pat. No. 6,436,738.

(51) Int. Cl.[7] .......................... H01L 29/00; H01L 21/82
(52) U.S. Cl. .................. 257/529; 257/209; 257/530; 438/132; 438/601
(58) Field of Search .................. 257/529, 530, 257/209; 438/132, 131, 600, 601

(56) References Cited

U.S. PATENT DOCUMENTS

| | | | | |
|---|---|---|---|---|
| 5,708,291 A | * | 1/1998 | Bohr et al. ............... | 257/529 |
| 5,821,558 A | * | 10/1998 | Han et al. ............... | 257/50 |
| 5,854,510 A | * | 12/1998 | Sur et al. ............... | 257/208 |
| 5,882,998 A | * | 3/1999 | Sur et al. ............... | 257/209 |
| 5,969,404 A | * | 10/1999 | Bohr et al. ............... | 257/529 |
| 6,323,534 B1 | * | 11/2001 | Marr et al. ............... | 257/209 |
| 6,436,738 B1 | * | 8/2002 | Yu ............... | 257/529 |

* cited by examiner

*Primary Examiner*—John F. Niebling
*Assistant Examiner*—Jennifer M. Kennedy
(74) *Attorney, Agent, or Firm*—George O. Saile; Stephen B. Ackerman; Stephen G. Stanton

(57) ABSTRACT

A fusible link device and a method of making same. The fusible link device comprising a poly layer having a center undoped portion and two doped end portions. The center undoped portion having a first resistance and the two doped end portions each having a second resistance that is lower than the first resistance. A silicide layer is formed over the poly layer with the silicide layer having a third resistance lower than the second resistance. The silicide layer agglomerating to form an electrical discontinuity within a discontinuity area in response to a predetermined programming potential being applied across the silicide layer, such that the resistance of the fusible link device can be selectively increased. The agglomeration of the silicide layer occurring over the center undoped portion of the poly layer. Contacts are electrically coupled to the two doped poly layer end portions for receiving the programming potential.

23 Claims, 3 Drawing Sheets

US 6,507,087 B1

SILICIDE AGGLOMERATION POLY FUSE DEVICE

This is a division of patent application Ser. No. 09/933,962, filing date Aug. 22, 2001, now U.S. Pat. No. 6,436,738, Silicide Agglomeration Poly Fuse Device, assigned to the same assignee as the present invention.

FIELD OF THE INVENTION

The present invention relates generally to semiconductor fabrication and more specifically to fusible link devices.

BACKGROUND OF THE INVENTION

Fusible link devices (fuses) disposed on integrated circuit (IC) semiconductor substrates provide discretionary electrical connections and permit permanent information to be stored or permanent connections on the integrated circuit after it is manufactured. Conventional undoped fuses have larger and unstable pre-program issues while fully doped fuses have smaller post-program resistance issues.

U.S. Pat. No. 5,708,291 to Bohr et al. describes a fusible link device including a silicide layer over a polysilicon layer.

U.S. Pat. No. 5,814,876 to Peyre-Lavigne et al. describes a doped poly fuse.

U.S. Pat. No. 5,625,291 to Takagi describes a process for fabricating an ion implanted (I/I) anti-fuse.

U.S. Pat. No. 5,793,094 to Sanchez et al. describes a doped poly anti-fuse.

SUMMARY OF THE INVENTION

Accordingly, it is all object of an embodiment of the present invention to provide an improved method of fabricating a fusible link device.

Another object of an embodiment of the present invention is to provide an improved fusible link device.

Other objects will appear hereinafter.

It has now been discovered that the above and other objects of the present invention may be accomplished in the following manner. Specifically, a fusible link device comprises a poly layer having a center undoped portion and two doped end portions. The center undoped portion having a first resistance and the two doped end portions each having a second resistance that is lower than the first resistance. A silicide layer is formed over the poly layer with the silicide layer having a third resistance lower than the second resistance. The silicide layer agglomerating to form an electrical discontinuity within a discontinuity area in response to a predetermined programming potential being applied across the silicide layer, such that the resistance of the fusible link device can be selectively increased. The agglomeration of the silicide layer occurring over the center undoped portion of the poly layer. Contacts are electrically coupled to the two doped poly layer end portions for receiving the programming potential.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

BRIEF SUMMARY OF THE INVENTION

The first and second embodiments of the fusible link device (fuse) of the present includes a silicide layer formed over a polysilicon (poly) layer and has a first unprogrammed resistance. The fuse is selectively doped using a special N+ or P+ implant layout to dope the poly layer on either side of, and spaced apart from, the silicide agglomeration area. The portion of the poly layer within the silicide agglomeration area is undoped. Doped and undoped poly layer portions are combined for optimal performance.

A predetermined programming potential is then applied across the silicide layer which agglomerates at the silicide agglomeration area to form an electrical discontinuity such that the resistance of the fusible link device can be selectively increased to a second programmed resistance. The doped and undoped areas used in the embodiments of the present invention take advantage of the advantages of doped N+/P+ fuses (i.e. smaller and better pre-programmed resistance) and undoped intrinsic poly fuses (i.e. larger post-programmed resistance) while avoiding their drawbacks.

Steps Common to Both Embodiments

Figure 3:
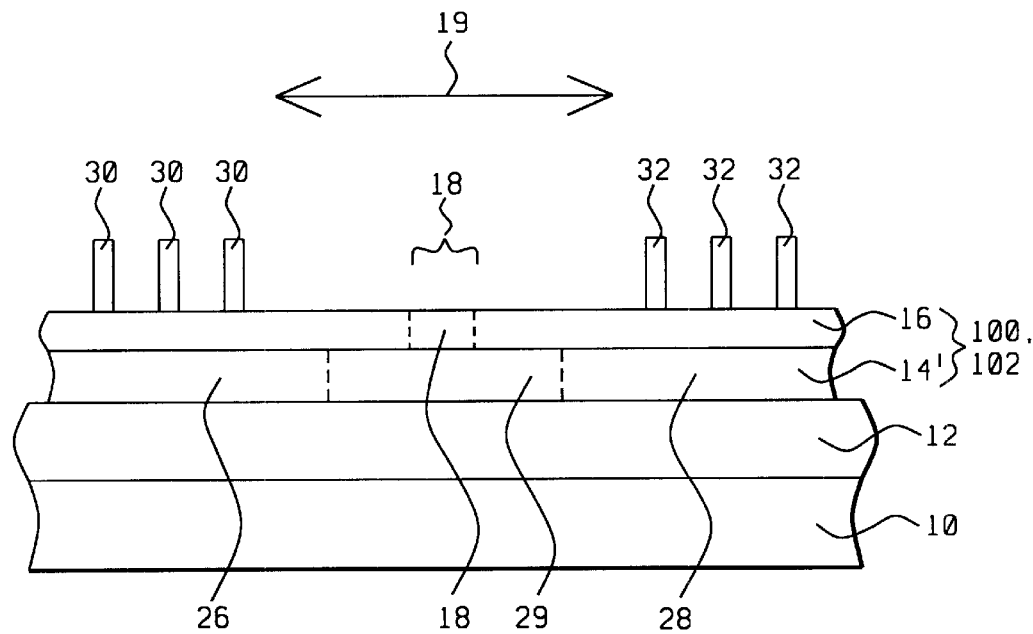
Figure 4:
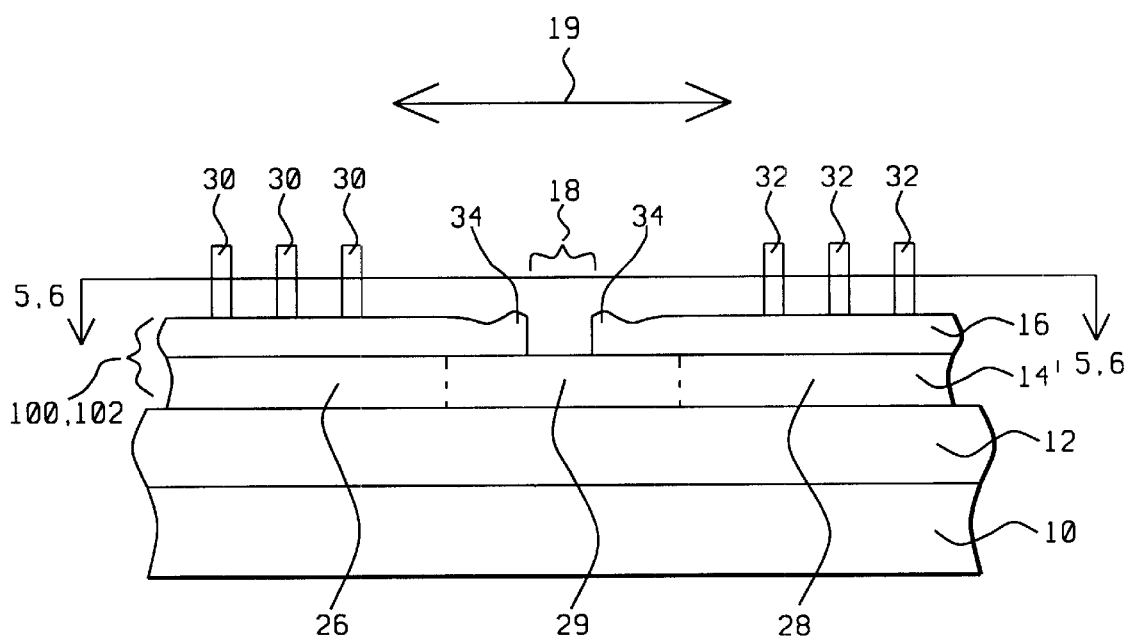
Figure 5:
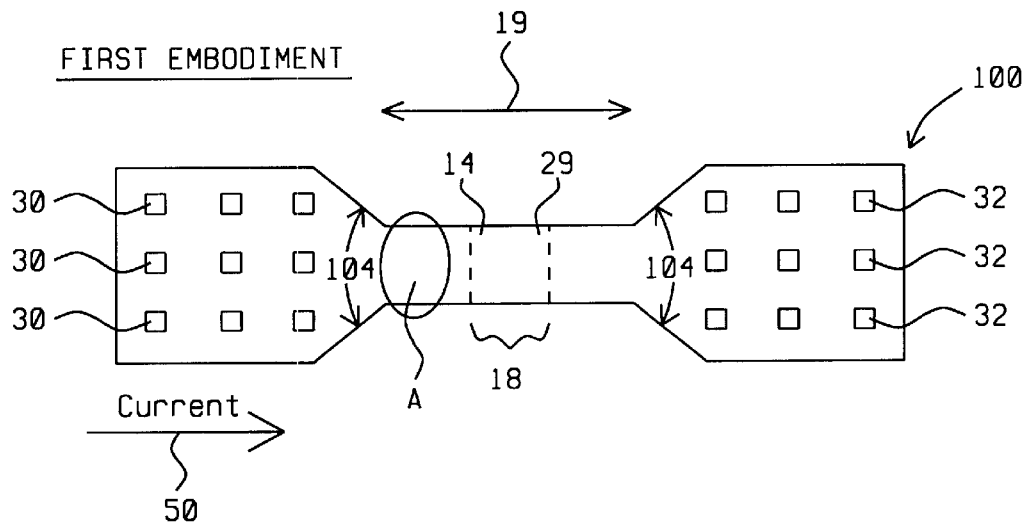
FIG. 5 schematically illustrates a plan view of the first embodiment fuse device of the present invention taken along line 5—5 of FIG. 4.
Figure 6:
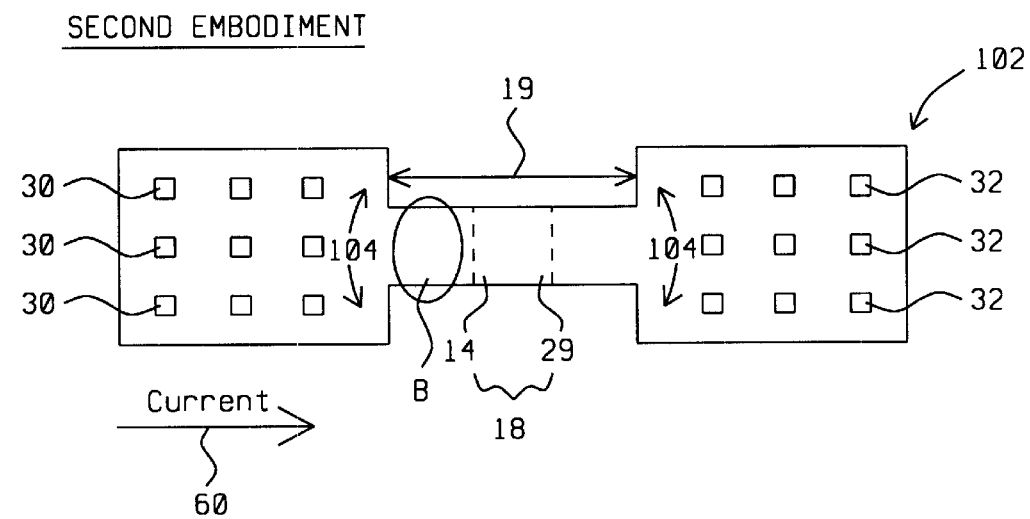
FIG. 6 schematically illustrates a plan view of the second embodiment fuse device of the present invention taken along line 6—6 of FIG. 4.

One skilled in the art will recognize that the side views of FIGS. 1 to 4 are common to both the FIG. 5 plan view of the more preferred first embodiment fuse device 100 and the FIG. 6 plan view of the preferred second embodiment fuse device 102.

Initial Structure

Figure 1:
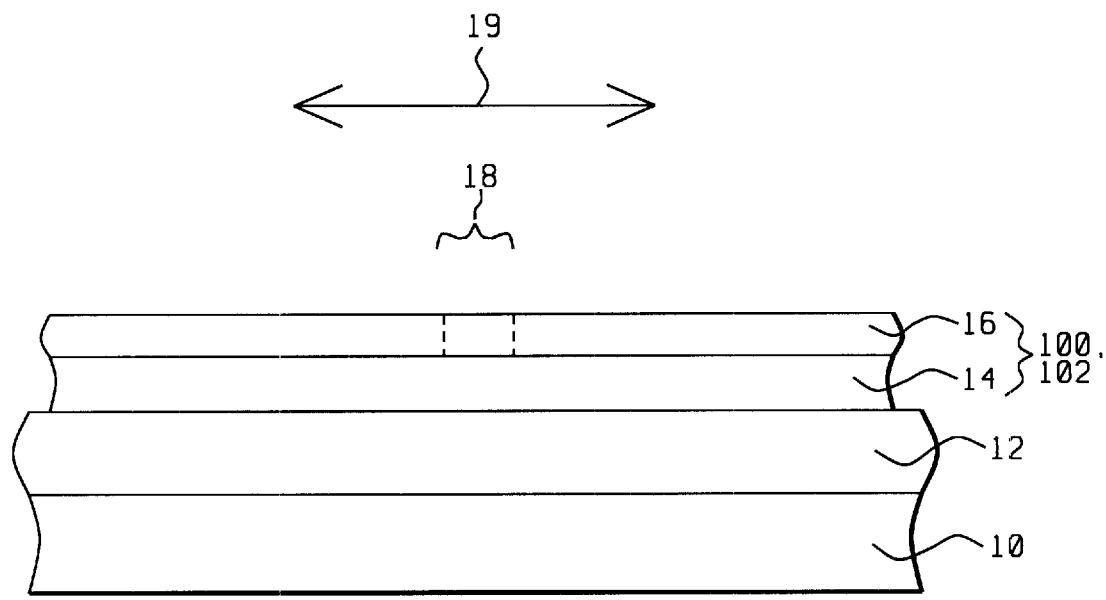
FIGS. 1 to 4 schematically illustrate the side view of the structure common to the first and second embodiments of the present invention.

FIG. 1 illustrates a side view common to the first and second embodiments of silicide agglomeration fuse devices 100, 102, respectively, of the present invention. FIG. 5, taken along line 5—5 of FIG. 4, illustrates the first, more preferred embodiment silicide agglomeration fuse device 100 that concentrates the current gradient, while FIG. 6, taken along line 6—6 of FIG. 4, illustrates the second embodiment silicide agglomeration fuse device 102 that does not concentrate the current gradient.

The fuse devices 100, 102 includes silicide layer 16 over polysilicon (poly) layer 14 and is disposed over a semiconductor substrate 10 and is usually part of a larger integrated circuit device. Silicide layer 16 may be comprised of a wide range of silicides such as $CoSi_2$, $TiSi_x$ or $NiSi_y$. Silicide layer 16 has a sheet resistance of preferably from about 2 to 10 ohms per square, and more preferably from about 3 to 7 ohms per square.

Poly layer 14 has a thickness of preferably from about 1000 to 4000 Å and more preferably from about 1500 to 2000 Å for the first embodiment fuse device 100 and a thickness of preferably from about 1000 to 4000 Å and more preferably from about 1500 to 2000 Å for the second embodiment fuse device 102.

Optionally, silicide layer 16 and poly layer 14 are formed by the same processing steps used to produce the polysilicon and silicide gate layers of other devices on the integrated circuit device.

An optional oxide layer 12 may be formed between the fuse device 100, 102. Optional oxide layer 12 has a thickness of preferably from about 3000 to 4000 Å for the first embodiment fuse device 100 and a thickness of preferably from about 3000 to 4000 Å for the second embodiment fuse device 102.

Fuse devices 100, 102 include silicide discontinuity area 18 (not necessarily shown to scale in the Figs.), within fuse region 19, that indicates the area where silicide layer 16 will agglomerate and form a discontinuity during programming which significantly increases the resistance of the fuse devices 100, 102 from about 100 ohm to about 1000 ohm, for example. This increase in resistance is caused because, before programming, the resistance of the fuse devices 100, 102 is determined by the lower resistance of the continuous silicide layer 16 (the path of least resistance), while after programming the resistance of the fuse devices 100, 102 is determined by the much higher resistance of the selectively doped poly layer 14. (Please note that for a current flow direction 50, 60 as shown in FIGS. 5 and 6 for the first and second embodiments of the present invention, respectively, discontinuity area 18, and subsequently discontinuity 36, will be generally located within region A, B, respectively.)

Key Step of the Invention—Selective Implantation of N+/P+

Figure 2:
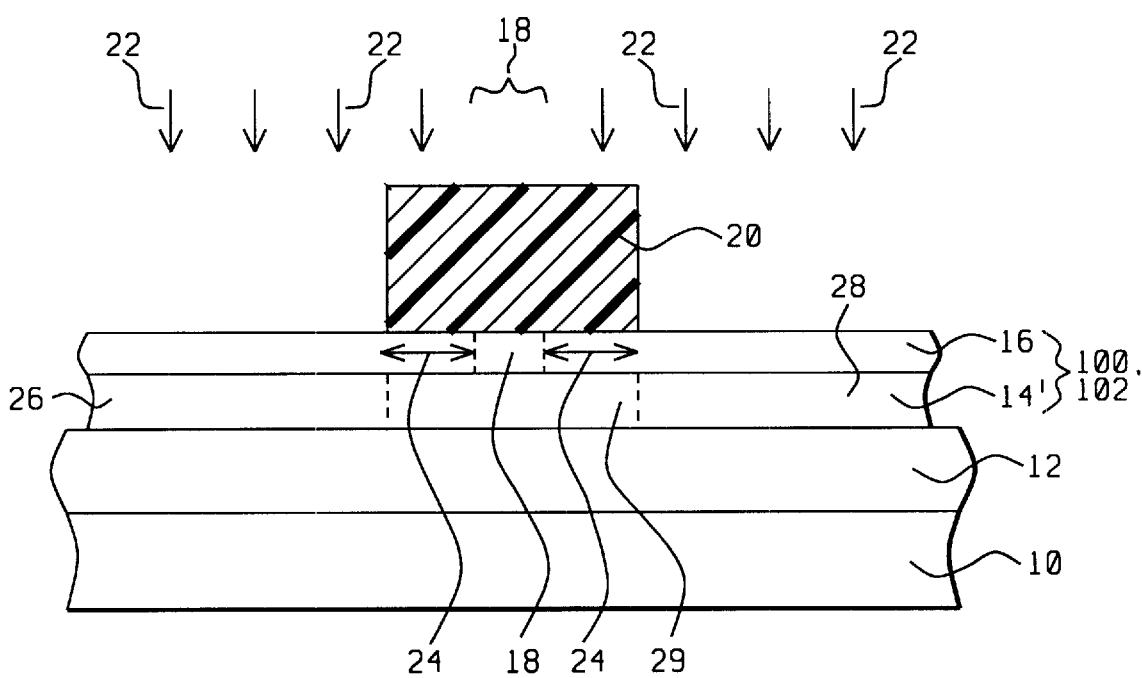

In a key step of the invention and as shown in FIG. 2, poly layer 14 is selectively doped using a special N+ or P+ implant layout to dope poly layer 14 on either side of, and spaced apart from at 24, the silicide discontinuity area 18. One side of the silicide agglomeration fuse devices 100, 102 may be N+ doped with the other respective sides being P+ doped.

For example and as shown in FIG. 2, mask 20 is formed over silicide layer 16 masking silicide discontinuity area 18 and extending on either side of silicide discontinuity area 18 by from about 1000 to 10,000 Å and more preferably from about 0.1 to 0.3 µm for the first embodiment fuse device 100; and from about 1000 to 10,000 Å and more preferably from about 0.1 to 0.3 µm for the second embodiment fuse device 102. Mask 20 may comprise patterned photoresist (PR) as shown in FIG. 2, for example.

N+ or P+ ions are then implanted as at 22 into poly layer 14 to form doped poly layer portions 26, 28 on either side of silicide discontinuity area 18 and spaced apart form discontinuity area 18 by a distance 24, leaving undoped poly layer portion 29. The distance 24 by which the doped poly layer portions 26, 28 are separated from the silicide discontinuity area 18 is determined by: (1) the post-program resistance; (2) the process tolerance; and (3) the programming tolerance. The doped poly layer portions 26, 28 may extend into the fuse region 19.

N+ or P+ ions are implanted to a concentration of preferably from about 1E15 to 8E15 atoms/cm$^3$ and more preferably from about 3E15 to 6E15 atoms/cm$^3$ for the first embodiment fuse device 100, and from about 1E15 to 8E15 atoms/cm$^3$ and more preferably from about 3E15 to 6E15 atoms/cm$^3$ for the second embodiment fuse device 102.

The selective N+/P+ doping of poly layer 14 achieves a sheet resistance of preferably from about 150 to 250 ohms per square, and from about 1000 to 10,000 ohms per square for the undoped poly layer 14'.

Optionally, the N+ or P+ doping may be accomplished before formation of silicide layer 16 over poly layer 14 in which case mask 20 is formed over poly layer 14.

Formation of Contacts 30

As shown in FIG. 3, contacts 30, 32 are then formed over the structure and in electrically communication with silicide layer 16. The contacts 30 may be formed before the N+ or P+ doping of poly layer 14. Contacts 30, 32 are preferably formed of tungsten (W), aluminum (Al) or copper (Cu) and are more preferably comprised of tungsten (W).

The number of contacts 30, 32 may vary. The nine contacts 30, 32 shown in FIGS. 5 and 6 are for illustrative purposes only.

Programming of Fuse Devices 100, 102

Fuse devices 100, 102 are programmed after completing the process and after the functionality is tested. Which fuses should be programmed is based upon certain algorithms. The programming could be performed by function testers or other devices however the programming should be done by electrical programming.

As shown in FIG. 4, a programming potential is applied across contacts 30, 32 to cause current to flow form one end of the fuse device 100, 102 to the other through the silicide layer 16. This current causes the silicide layer 16 to heat up and the silicide itself to agglomerate as indicated at 34 within silicide discontinuity region 18. A discontinuity 36 is thus formed in silicide layer 16 with silicide discontinuity region 18. As discussed above, this markedly increases the resistance of the fuse devices 100, 102 as any current applied across contacts 30, 32 must now pass through undoped poly layer portion 29.

As noted above, undoped poly layer portion 29 provides an even greater increased post-program resistance than if that portion 29 comprised doped poly. Further, by spacing doped poly layer portions 26, 28 apart from silicide discontinuity area 18 in accordance with the present invention, a maximum increase in pre-programmed resistance: post-programmed resistance of the fuse devices 100, 102 may be achieved. The increase in the pre-programmed resistance; post-programmed resistance of the fuse devices 100, 102 may be adjusted/fine tuned by adjusting the distance 24 between the silicide discontinuity area 18 and the doped poly layer portions 26, 28.

First Embodiment

FIG. 5 is taken along line 5—5 of FIG. 4 and illustrates a plan view of the more preferred first embodiment fuse device 100 that concentrates the current gradient due to tapered transitional region 104. The geometry of the transition region 104 between the contacts 30, 32 and the fuse region 19 contributes to the low programming voltage by focusing the current density flowing through the fuse device 102 into the fuse region 19.

The programming potential may be a low as preferably from about 0.5 to 2 volts and is more preferably about 1 volts.

Second Embodiment

FIG. 6 is taken along line 6—6 of FIG. 4 and illustrates a plan view of the preferred second embodiment fuse device 102 that does not concentrate the current gradient.

The programming potential may be a low as preferably from about 0.5 to 2 volts and is more preferably about 1 volts.

The present invention will provide smaller and better control pre-program resistance.

While particular embodiments of the present invention have been illustrated and described, it is not intended to limit the invention, except as defined by the following claims.

I claim:

1. A fusible link device, comprising:
   a poly layer having a center undoped portion and two doped end portions; the center undoped portion having a first resistance and the two doped end portions each having a second resistance that is lower than the first resistance;

a silicide layer formed over the poly layer, the silicide layer having a third resistance lower than the second resistance; the silicide layer agglomerating to form an electrical discontinuity within a discontinuity area in response to a predetermined programming potential being applied across the silicide layer, such that the resistance of the fusible link device can be selectively increased; the agglomeration of the silicide layer occurring over the center undoped portion of the poly layer; and contacts electrically coupled to the two doped poly layer end portions for receiving the programming potential.

2. The device of claim 1, wherein the two doped poly layer end portions being doped with a dopant selected from the group consisting of As, B and P.

3. The device of claim 1, wherein the two doped poly layer end portions are each doped with an N+ dopant or a P+ dopant.

4. The device of claim 1, wherein the silicide layer is comprised of a material selected from the group consisting of $CoSi_2$, $TiSi_x$ and $NiSi_y$; and the poly layer is polysilicon.

5. The device of claim 1, wherein the silicide layer is comprised of $CoSi_2$; and the poly layer is polysilicon.

6. The device of claim 1, wherein poly layer is from about 1000 to 4000 Å thick.

7. The device of claim 1, wherein poly layer is from about 1500 to 2000 Å thick.

8. The device of claim 1, wherein the fusible link device is formed over an oxide layer.

9. The device of claim 1, wherein the fusible link device is formed over an oxide layer having a thickness of from about 3000 to 4000 Å.

10. The device of claim 1, wherein the programming potential is from about 0.5 to 2 volts.

11. The device of claim 1, wherein the programming potential is about 1 volt.

12. The device of claim 1, wherein the fusible link device includes a tapered transitional region to concentrate a current gradient induced by the predetermined programming potential.

13. A fusible link device, comprising:

a poly layer having a center undoped portion and two doped end portions; the center undoped portion having a first resistance and the two doped end portions each having a second resistance that is lower than the first resistance; wherein the two doped poly layer end portions are each doped with an N+ dopant or a P+ dopant;

a silicide layer formed over the poly layer, the silicide layer having a third resistance lower than the second resistance; the silicide layer agglomerating to form an electrical discontinuity within a discontinuity area in response to a predetermined programming potential being applied across the silicide layer, such that the resistance of the fusible link device can be selectively increased; the agglomeration of the silicide layer occurring over the center undoped portion of the poly layer; and contacts electrically coupled to the two doped poly layer end portions for receiving the programming potential.

14. The device of claim 13, wherein the two doped poly layer end portions being doped with a dopant selected from the group consisting of As, B and P.

15. The device of claim 13, wherein the silicide layer is comprised of a material selected from the group consisting of $CoSi_2$, $TiSi_x$ and $NiSi_y$; and the poly layer is polysilicon.

16. The device of claim 13, wherein the silicide layer is comprised of $CoSi_2$; and the poly layer is polysilicon.

17. The device of claim 13, wherein poly layer is from about 1000 to 4000 Å thick.

18. The device of claim 13, wherein poly layer is from about 1500 to 2000 Å thick.

19. The device of claim 13, wherein the fusible link device is formed over an oxide layer.

20. The device of claim 13, wherein the fusible link device is formed over an oxide layer having a thickness of from about 3000 to 4000 Å.

21. The device of claim 13, wherein the programming potential is from about 0.5 to 2 volts.

22. The device of claim 13, wherein the programming potential is about 1 volt.

23. The device of claim 13, wherein the fusible link device includes a tapered transitional region to concentrate a current gradient induced by the predetermined programming potential.

* * * * *